(12) United States Patent
Kuo et al.

(10) Patent No.: US 11,488,679 B1
(45) Date of Patent: Nov. 1, 2022

(54) METHOD FOR GRADING A MEMORY

(71) Applicant: TEAM GROUP INC., New Taipei (TW)

(72) Inventors: Hsi-Lin Kuo, New Taipei (TW); Ming-Hsun Chung, New Taipei (TW); Chin-Feng Chang, New Taipei (TW)

(73) Assignee: TEAM GROUP INC., New Taipei (TW)

( * ) Notice: Subject to any disclaimer, the term of this patent is extended or adjusted under 35 U.S.C. 154(b) by 0 days.

(21) Appl. No.: 17/447,637

(22) Filed: Sep. 14, 2021

(30) Foreign Application Priority Data

Jul. 30, 2021 (TW) .................. 110127994

(51) Int. Cl.
*G11C 29/00* (2006.01)
*G11C 29/10* (2006.01)
*G11C 29/36* (2006.01)
*G11C 29/46* (2006.01)
*G11C 29/12* (2006.01)

(52) U.S. Cl.
CPC ........ *G11C 29/10* (2013.01); *G11C 29/12015* (2013.01); *G11C 29/36* (2013.01); *G11C 29/46* (2013.01); *G11C 2029/3602* (2013.01)

(58) Field of Classification Search
CPC ... G11C 29/10; G11C 29/12015; G11C 29/36; G11C 29/46; G11C 2029/3602
See application file for complete search history.

(56) References Cited

U.S. PATENT DOCUMENTS

| 5,422,852 A * | 6/1995 | Houston ............... G11C 29/50 365/201 |
| 11,016,705 B2 * | 5/2021 | Zhang ................. G06F 3/0604 |
| 2003/0041295 A1 * | 2/2003 | Hou ...................... G11C 29/74 714/710 |
| 2021/0216398 A1 * | 7/2021 | Davis .................. G06F 11/1048 |

\* cited by examiner

*Primary Examiner* — Christine T. Tu
(74) *Attorney, Agent, or Firm* — Christopher R. Christenson; Kelly, Holt & Christenson, PLLC

(57) ABSTRACT

Disclosed is a method for grading memory modules comprising: a testing step which applies at least one test procedure to test a memory, each test procedure is provided with a reliability test; and a grading step which grades the memory into corresponding grade level according to test results of said at least one test procedure, and each test result includes a reliability test result wherein the reliability test has the following steps in sequence: performing a data-writing operation on the memory, wherein the data-writing operation is an operation that writes data to the memory; stopping electric charging the memory; halting a predetermined time period; electric charging the memory; checking data integrity of the memory; and generating the reliability test result according to the data integrity.

10 Claims, 2 Drawing Sheets

Data-writing operation

Data-reading operation

METHOD FOR GRADING A MEMORY

CROSS-REFERENCE TO RELATED APPLICATION

This application claims priority to the Taiwanese Patent Application No. 110127994, filed on Jul. 30, 2021, which is incorporated herein by reference in its entirety.

FIELD OF THE INVENTION

The present invention relates to testing a memory, and more particularly relates to a method for grading a memory.

BACKGROUND OF THE INVENTION

A memory, which is a printed circuit board on which memory ICs are mounted, is an important data storage component for a computer. With the variety of computer operating environments, memories are classified by being graded to several grading levels for meeting different requirements. In order to meet the different requirements, for example, the memory could be graded to a general consumer grade, which is for normal users, an industrial grade and gaming grade, which both require high operational stability. The higher the graded level is, the memory module is more durable to operate in the strict environment. To ensure the memory functional operated in different environments, the conventional grading methods are employed to test the memory in different environments, respectively. Taking grading the memory into the three grades, i.e., the general consumer grade, the industrial grade and the gaming grade, as an example, the conventional grading methods have to prepare three different test environments for performing the respective grading tests corresponding to the three grades. However, it is costly to maintain these test environments.

SUMMARY OF THE INVENTION

Based on the reason that the data retaining time for memory situated in a harsh environment is shorter than that in a normal environment, accordingly, the present invention applies the factor of data retaining time to test an environmental stability for memory. The objective of the present invention is to provide a method for grading a memory by using different halting time period between electrical charging operations to test whether the memory-to-be-test is able to be durable in corresponding environment.

In order to overcome the technical problems in prior art, the present invention provides a method for grading a memory, comprising the following steps in sequence: a testing step which applies at least one test procedure to test a memory, wherein each test procedure is provided with at least one test item, one of said at least one test item is a reliability test; and a grading step which grades, by a processing unit, the memory into corresponding grade level according to test results of said at least one test procedure, and each test result includes a reliability test result obtained by the reliability test, wherein the reliability test has the following steps in sequence: (i) performing a data-writing operation on the memory by the processing unit, wherein the data-writing operation is an operation that writes data to the memory; (ii) stopping electric charging the memory; (iii) halting a predetermined time period; (iv) electric charging the memory; (v) checking data integrity of the memory; and (vi) generating the reliability test result according to the data integrity.

In one embodiment of the present invention, the method for grading a memory is provided, wherein the testing step applies a plurality of test procedures, the plurality test procedures are operated in sequence, and all different reliability tests are performed under the same test environment.

In one embodiment of the present invention, the method for grading a memory is provided, wherein when one test item of one test procedure fails, all test procedures following said one test procedure will not operate.

In one embodiment of the present invention, the method for grading a memory is provided, wherein the predetermined time periods defined for the plurality of test procedures are different, the predetermined time period defined in the test procedure prior operated is shorter than the predetermined time period defined in the test procedure operated later.

In one embodiment of the present invention, the method for grading a memory is provided, wherein the predetermined time period is related to a grade-specific operating temperature corresponding to the test procedure to which the predetermined time period belongs.

In one embodiment of the present invention, the method for grading a memory is provided, wherein the processing unit performs the data-writing operation on the memory according a mapping table in which a relationship between memory logic addresses of the processing unit and memory physical addresses of said memory is recorded, and the data-writing operation writes the data into the memory physical addresses according to a sequence of the memory logic addresses of the processing unit.

In one embodiment of the present invention, the method for grading a memory is provided, wherein the data-writing operation writes data into a complete row, and then writes the data into a consecutive complete row.

In one embodiment of the present invention, the method for grading a memory is provided, wherein in the reliability test, the data-writing operation performs writing data into all addresses of the memory, and then performs data integrity for said memory.

In one embodiment of the present invention, the method for grading a memory is provided further comprising, after the grading step, a result-writing step which writes the test results into the memory.

The technical means adopted by the present invention is based on the reason that the data retaining time for data retained in memory situated in a harsh environment is shorter than that in a normal environment, and therefore the industrial-grade and gaming-grade memories that are more durable with higher operational stability possess longer data retaining times than that of the general-consumer-grade memory. The method for grading a memory of the present invention tests whether the data retaining time period is within a safe range by halting electric charging for a predetermined time period between two electric charging operations so as to determine whether the memory could be durable in the specific environments according to the predetermined time period.

DETAILED DESCRIPTION OF THE PREFERRED EMBODIMENTS

The preferred embodiments of the present invention are described in detail below with reference to FIG. 1 to FIG. 3b. The description is used for explaining the embodiments of the present invention only, but not for limiting the scope of the claims.

Figure 1:
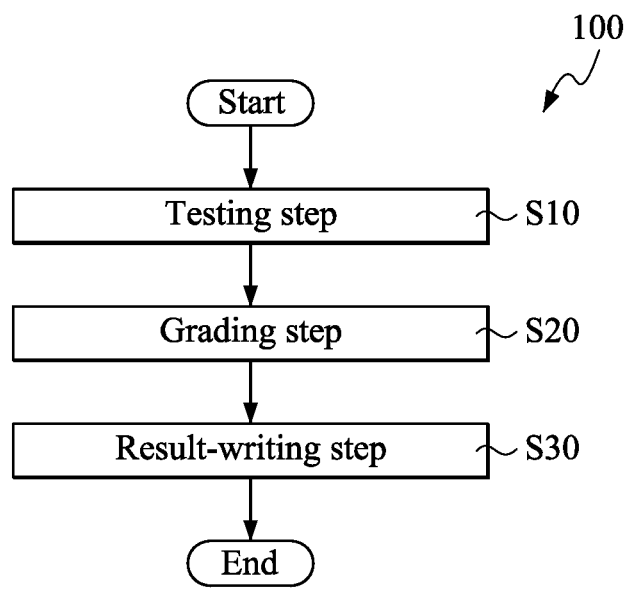
FIG. 1 is a flow chart illustrating a method for grading a memory according to one embodiment of the present invention.

As shown in FIG. 1, a method 100 for grading a memory according to one embodiment of the present invention comprises the following steps in sequence: a testing step S10 and a grading step S20.

In the testing step S10, a processing unit is provided to grade the memory M. The processing unit and the memory M are disposed on the same motherboard. The memory M is tested with at least one test procedure in the testing step S10. Each test procedure is provided with a plurality of test items. One of said at least one test item in each test procedure is a reliability test. For example, in the present application, three test procedures are provided, which are a test procedure A, a test procedure B and a test procedure C respectively. The three test procedures are preferably operated under the same test environment. In other embodiments, only one test procedure is provided. Each test procedure may further include test items such as a defect test, an electrical property test, a structural strength test except for the reliability test.

The sequence of the test procedures are sorted according to their degree of strictness. The less strict test procedures are operated prior, and the stricter test procedures are operated later. Therefore, after a first test procedure is operated, failed or low-grade memories will be excluded from testing of the following test procedure. It goes without saying that in other embodiments, the stricter test procedures can be operated prior, and the less strict test procedures can be operated later, or the sequence of the test procedures are sorted according to other criteria.

In the grading step S20, the processing unit grades the memory into corresponding grade level according to test results of said at least one test procedure. Each test procedure corresponds to all conditions for their respective specific grade levels. For example, if a memory passed the test procedure A, the memory will be graded as a grade level A or above, and the memory still needs to be further tested with the test procedure B. In the present embodiment, the memory that has passed the test procedure A and failed to pass the test procedure B will be graded into A-grade memory. The memory that has passed the test procedure B and failed to pass the test procedure C will be graded into B-grade memory. The memory that has passed the test procedure C will be graded into C-grade memory. The test result of each test procedure includes a reliability test result.

When one test item of one test procedure fails, all test procedures following said one test procedure will not operate. For example, when one test item in the test procedure B fails, the memory is sure to be graded as the grade level A and the test item of the test procedure C is not required to be operated.

Figure 2:
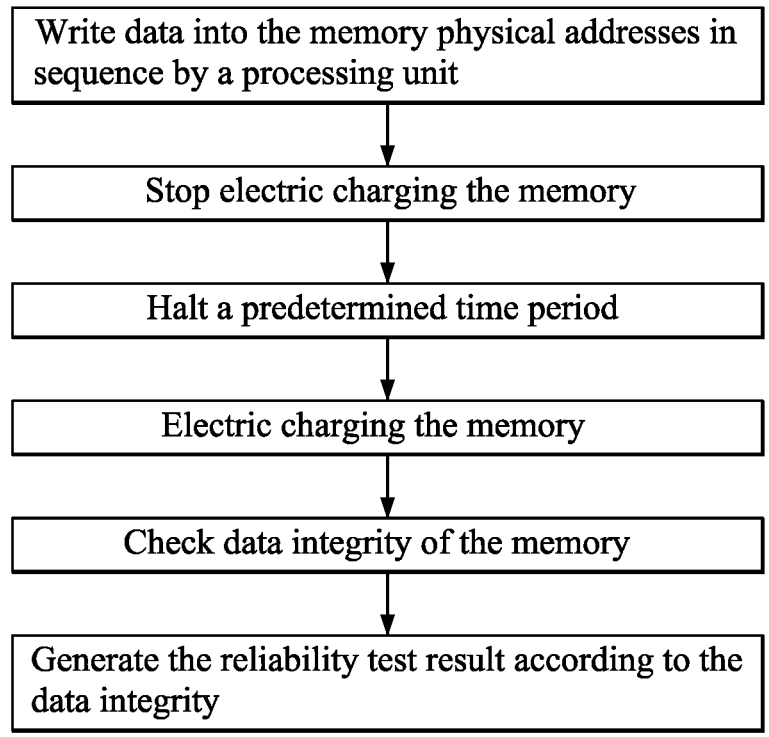
FIG. 2 is a flow chart illustrating a reliability test of the method for grading a memory according to the embodiment of the present invention.

As shown in FIG. 2, in the method 100 for grading a memory according to the embodiment of the present invention, the reliability test has the following steps in sequence: (i) performing a data-writing operation on the memory by the processing unit, wherein the data-writing operation is an operation that writes data to the memory; (ii) stopping electric charging the memory; (iii) halting a predetermined time period; (iv) electric charging the memory; (v) checking data integrity of the memory; and (vi) generating the reliability test result according to the data integrity.

In detail, in the present embodiment, the processing unit performs the data-writing operation on the memory according a mapping table. In the mapping table, a relationship between memory logic addresses of the processing unit and memory physical addresses of said memory is recorded. In the data-writing operation, the data is written into the memory physical addresses according to a sequence of the memory logic addresses of the processing unit.

Figure 3A:
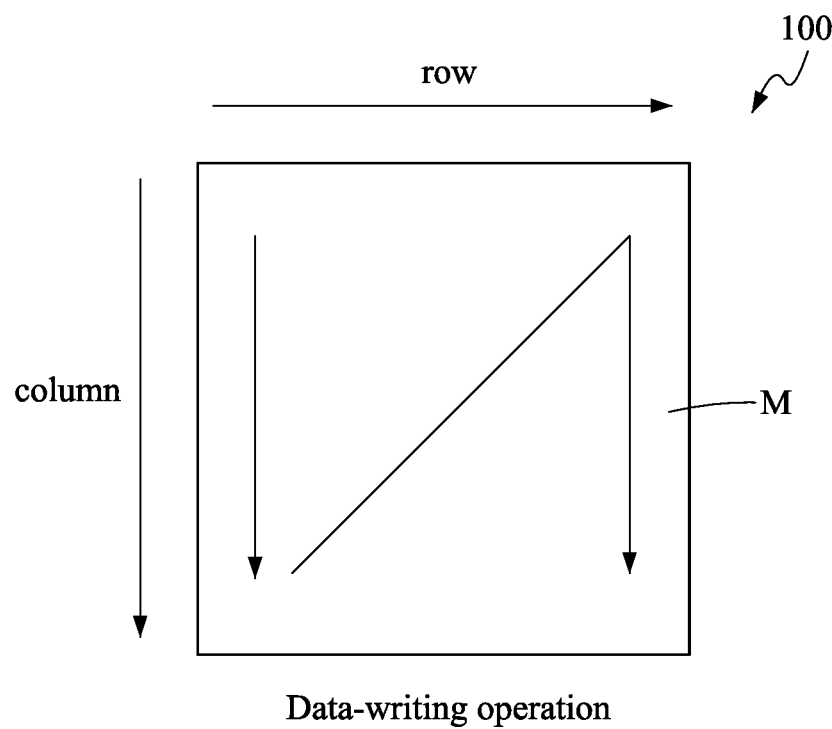
FIG. 3a is a schematic drawing illustrating the method for grading a memory while performing a data-writing operation according to the embodiment of the present invention.

As shown in FIG. 3a, in the method 100 for grading a memory according to the embodiment of the present invention, the data-writing operation writes data into a complete row of the memory physical addresses, and then writes the data into a consecutive complete row of the memory physical addresses until all memory physical addresses of said memory M are written, so that the refresh time that the system fully act on the memory.

Figure 3B:
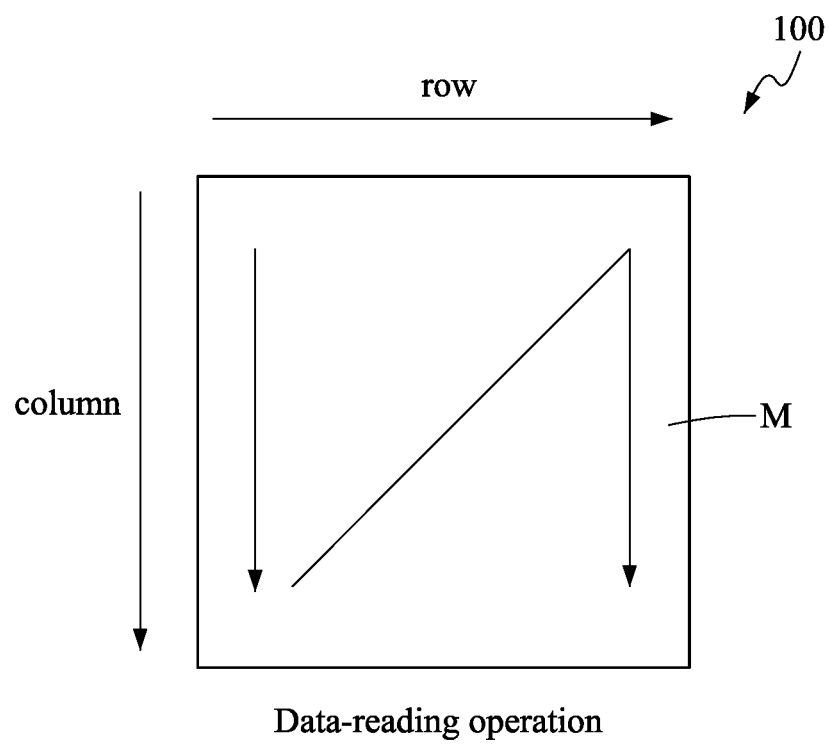
FIG. 3b is a schematic drawing illustrating the method for grading a memory while performing a data-reading operation according to the embodiment of the present invention.

Similarly, as shown in FIG. 3b, in the method 100 for grading a memory according to the embodiment of the present invention, the data-reading operation reads data from a complete row, and then reads data from a consecutive complete row until all memory physical addresses of said memory M are read.

In other embodiments, the processing unit can write data into the memory physical addresses in a random sequence.

In this embodiment, in the reliability test, writing data to all memory physical addresses of the memory M, stopping electric charging the memory M, halting a predetermined time period, electric charging the memory M, and checking data integrity of the memory M are perform in sequence. In other embodiment, pipelining may be applied for memory segments to respectively perform writing data to all memory physical addresses of the memory M, stopping electric charging the memory M, halting a predetermined time period, electric charging the memory M, and checking data integrity of the memory M.

In the method 100 for grading a memory according to the embodiment of the present invention, the predetermined time periods defined for the plurality of test procedures are different. Because the data retaining time for data retained in memory situated in a harsh environment is shorter than that in a normal environment, the industrial-grade and gaming-grade memories that are with higher operational stability are required longer data retaining times. Memories that can pass the reliability test with a longer predetermined time period represent that the memories have better data storing ability and are more suitable for harsher environment. In the present embodiment, the predetermined time period defined in the test procedure prior operated is shorter than the predetermined time period defined in the test procedure operated later. That is, the predetermined time period of test procedure A<the predetermined time period of test procedure B<the predetermined time period of test procedure C.

The predetermined time period is determined according to the following criteria: data retaining time period required by a use environment that corresponds to the test procedure, and a relationship between the data retaining time period of the memories in the test environment and a data retaining period time period required by a use environment.

For example, assuming that the data retaining time period of the industrial-grade memories required by the corresponding use environment is 100 ms, after learning that the data retaining time period of the memories in the test environment is double of the data retaining time period required by industrial use environment, a predetermined time period of 200 ms for the test procedure corresponding to the industrial grade can be obtained.

Specifically, the use environment requirements can be one or more of a grade-specific operating temperature, a grade-specific anti-surge ability, a grade-specific anti-static ability, etc. for each grade level.

As a result, the memory M can be tested in a desired test environment in the testing step S10 without the necessity of being placed in the harsh environment for testing. Furthermore, the memories M of different feasible operating temperatures, anti-surge abilities, or anti-static abilities can be graded.

The data integrity check of the memory is used for checking the data written, if the data written is unchanged, it represents the memory can hold the data written for a predetermined time period without charging, and therefore a passed reliability test result is generated. If the data written is lost, a failed reliability test result is generated.

As shown in FIG. 1, in the method 100 for grading a memory according to the embodiment of the present invention, there is a result-writing step S30 after the grading step S20. In the result-writing step S30, the processing unit writes the test results into a specific field of the memory M (such as EEPROM and SPI ROM). In other embodiments, the result-writing step may be omitted, and the grade level of the memory may be shown on a label or a package thereof.

The above description should be considered as only the discussion of the preferred embodiments of the present invention. However, a person having ordinary skill in the art may make various modifications without deviating from the present invention. Those modifications still fall within the scope of the present invention.

What is claimed is:

1. A method for grading a memory, comprising the following steps in sequence:
    a testing step which applies a plurality of test procedures to test the memory, wherein each test procedure is provided with at least one test item, one of said at least one test item is a reliability test, and all reliability tests are performed under the same test environment which is with a standard different from a grade-specific use environment, each of the reliability tests performed under the test environment applies a predetermined time period as a parameter to simulate a use environment reliability test that is performed under the grade-specific use environment; and
    a grading step which grades, by a processing unit, the memory into corresponding grade level according to test results of the plurality of test procedures, and each test result includes a reliability test result obtained by each of the reliability tests, wherein each reliability test has the following steps in sequence:
        (i) performing a data-writing operation on the memory by the processing unit, wherein the data-writing operation is an operation that writes data to the memory;
        (ii) stopping electric charging the memory;
        (iii) halting the predetermined time period;
        (iv) electric charging the memory;
        (v) checking data integrity of the memory; and
        (vi) generating the reliability test result according to the data integrity.

2. The method for grading a memory of claim 1, wherein the plurality test procedures are operated in sequence.

3. The method for grading a memory as claimed in claim 2, wherein when one test item of one test procedure fails, all test procedures following said one test procedure will not operate.

4. The method for grading a memory as claimed in claim 2, wherein the predetermined time periods defined for the plurality of test procedures are different, the predetermined time period defined in the test procedure prior operated is shorter than the predetermined time period defined in the test procedure operated later.

5. The method for grading a memory as claimed in claim 1, wherein the predetermined time period is related to a grade-specific operating temperature corresponding to the test procedure to which the predetermined time period belongs.

6. The method for grading a memory as claimed in claim 2, wherein the predetermined time period is related to a grade-specific operating temperature corresponding to the test procedure to which the predetermined time period belongs.

7. The method for grading a memory as claimed in claim 1, wherein the processing unit performs the data-writing operation on the memory according a mapping table in which a relationship between memory logic addresses of the processing unit and memory physical addresses of said memory is recorded, and the data-writing operation writes the data into the memory physical addresses according to a sequence of the memory logic addresses of the processing unit.

8. The method for grading a memory as claimed in claim 1, wherein the data-writing operation writes data into a complete row, and then writes the data into a consecutive complete row.

9. The method for grading a memory as claimed in claim 1, wherein in the reliability test, the data-writing operation performs writing data into all addresses of the memory, and then performs data integrity for said memory.

10. The method for grading a memory as claimed in claim 1, further comprising, after the grading step, a result-writing step which writes the test results into the memory.

* * * * *